(12) United States Patent  
Fujimoto et al.

(10) Patent No.: US 9,123,577 B2  
(45) Date of Patent: Sep. 1, 2015

(54) AIR GAP ISOLATION IN NON-VOLATILE MEMORY USING SACRIFICIAL FILMS

(71) Applicant: SanDisk Technologies Inc., Plano, TX (US)

(72) Inventors: Hitomi Fujimoto, Yokkaichi (JP); Hiroaki Iuchi, Nagoya (JP); Ming Tian, Shanghai (CN); Daisuke Maekawa, Yokkaichi (JP)

(73) Assignee: SanDisk Technologies Inc., Plano, TX (US)

( * ) Notice: Subject to any disclaimer, the term of this patent is extended or adjusted under 35 U.S.C. 154(b) by 98 days.

(21) Appl. No.: 13/712,788

(22) Filed: Dec. 12, 2012

(65) Prior Publication Data

US 2014/0159135 A1    Jun. 12, 2014

(51) Int. Cl.
| | |
|---|---|
| H01L 21/764 | (2006.01) |
| H01L 27/11 | (2006.01) |
| H01L 21/762 | (2006.01) |
| H01L 29/66 | (2006.01) |
| H01L 29/788 | (2006.01) |
| H01L 27/115 | (2006.01) |

(52) U.S. Cl.
CPC ............. *H01L 27/11* (2013.01); *H01L 21/764* (2013.01); *H01L 21/76224* (2013.01); *H01L 27/11521* (2013.01); *H01L 29/66825* (2013.01); *H01L 29/7881* (2013.01); *H01L 27/11568* (2013.01)

(58) Field of Classification Search
None
See application file for complete search history.

(56) References Cited

U.S. PATENT DOCUMENTS

| | | | |
|---|---|---|---|
| 6,210,749 B1 * | 4/2001 | Bremmer et al. | ..... 427/126.2 |
| 7,511,994 B2 | 3/2009 | Aritome | |
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis et al. | |

(Continued)

FOREIGN PATENT DOCUMENTS

| | | |
|---|---|---|
| EP | 1418618 A2 | 5/2004 |
| EP | 1372687 A1 | 6/2006 |
| EP | 1835530 A2 | 9/2007 |

OTHER PUBLICATIONS

Ragunathan, Shyam, et al., "Investigation of Ballistic Current in Scaled Floating-gate NAND FLASH and a Solution," IEEE International Electron Devices Meeting (IEDM), Dec. 2009, pp. 34.1.1-34.1.4.

(Continued)

*Primary Examiner* — Bilkis Jahan  
*Assistant Examiner* — Kevin Quinto  
(74) *Attorney, Agent, or Firm* — Vierra Magen Marcus LLP

(57) ABSTRACT

Electrical isolation in non-volatile memory is provided by air gaps formed using sacrificial films of differing etch rates. A high etch rate material is formed in an isolation trench. Flowable chemical vapor deposition processes are used to form high etch rate films, and curing is performed to increase their etch rate. A low etch material is formed over the high etch rate material and provides a controlled etch back between charge storage regions in a row direction. A discrete low etch rate layer can be formed or the high etch rate material can be oxidized to form an upper region with a lower etch rate. A controlled etch back enables formation of a wrap-around dielectric and control gate structure in the row direction with minimized variability in the dimensions of the structures. At least a portion of the high etch rate material is removed to form air gaps for isolation.

22 Claims, 13 Drawing Sheets

(56) References Cited

U.S. PATENT DOCUMENTS

| | | | |
|---|---|---|---|
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,325,529 B2 | 12/2012 | Huang et al. | |
| 8,362,542 B2 | 1/2013 | Kang et al. | |
| 8,383,479 B2 | 2/2013 | Purayath | |
| 2006/0194390 A1 | 8/2006 | Imai et al. | |
| 2007/0184615 A1 | 8/2007 | Brazzelli et al. | |
| 2007/0257305 A1 | 11/2007 | Sasago et al. | |
| 2008/0003743 A1 | 1/2008 | Lee | |
| 2008/0283898 A1 | 11/2008 | Kuniya | |
| 2009/0059669 A1 | 3/2009 | Toriyama et al. | |
| 2009/0212352 A1 | 8/2009 | Aoyama et al. | |
| 2009/0267131 A1 | 10/2009 | Nitta | |
| 2010/0019311 A1 | 1/2010 | Sato et al. | |
| 2010/0127320 A1 | 5/2010 | Nishihara et al. | |
| 2010/0219467 A1* | 9/2010 | Kim | 257/330 |
| 2010/0230741 A1 | 9/2010 | Choi et al. | |
| 2011/0057250 A1 | 3/2011 | Higashi | |
| 2011/0303967 A1 | 12/2011 | Harari et al. | |
| 2011/0309425 A1 | 12/2011 | Purayath et al. | |
| 2011/0309426 A1 | 12/2011 | Purayath et al. | |
| 2011/0309430 A1 | 12/2011 | Purayath et al. | |
| 2012/0049245 A1 | 3/2012 | Bicksler et al. | |
| 2012/0126303 A1 | 5/2012 | Arai et al. | |
| 2012/0126306 A1 | 5/2012 | Kawaguchi et al. | |
| 2012/0178235 A1* | 7/2012 | Pachamuthu et al. | 438/421 |
| 2012/0276713 A1 | 11/2012 | Miyahara et al. | |
| 2013/0102124 A1* | 4/2013 | Nakazawa | 438/422 |

OTHER PUBLICATIONS

Ragunathan, Shyam, et al., "Investigation of Ballistic Current in Scaled Floating-gate NAND FLASH and a Solution," Powerpoint Presentation, IEEE International Electron Devices Meeting (IEDM), Dec. 2009, pp. 1-38.

International Search Report & The Written Opinion of the International Searching Authority dated Feb. 17, 2014, International Application No. PCT/US2013/070839.

U.S. Appl. No. 13/472,337, filed May 15, 2012.

U.S. Appl. No. 13/768,934, filed Feb. 15, 2013.

* cited by examiner

FIG. 1
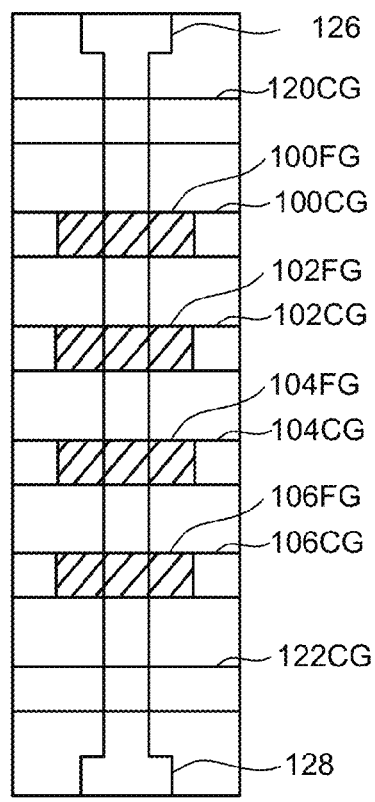
FIG. 2
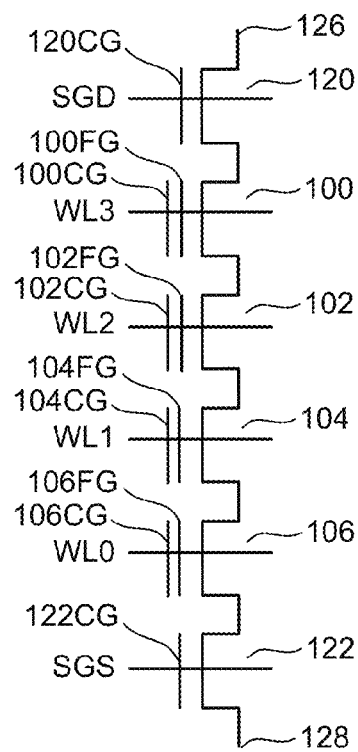
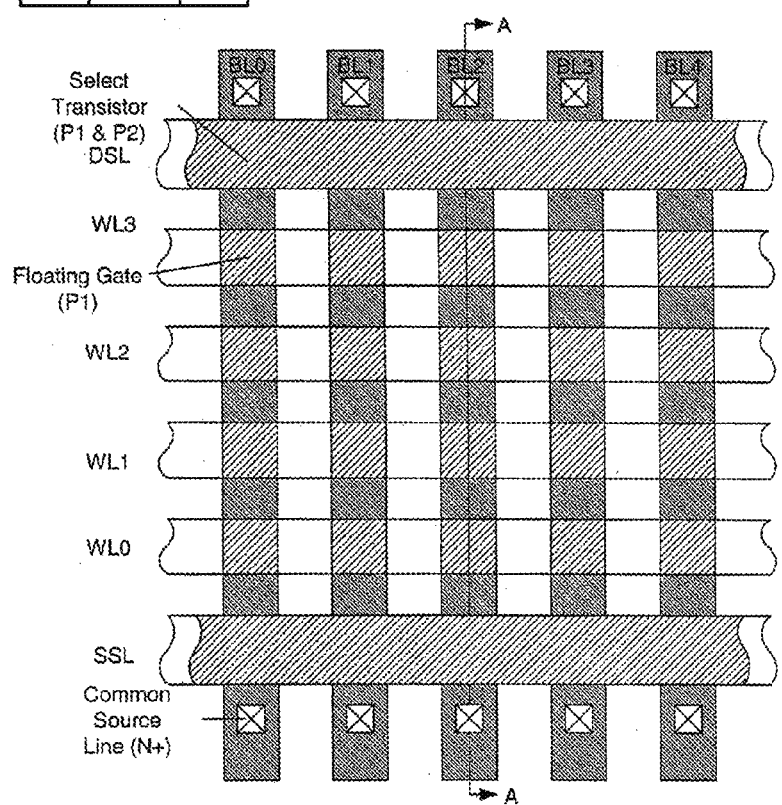
FIG. 3

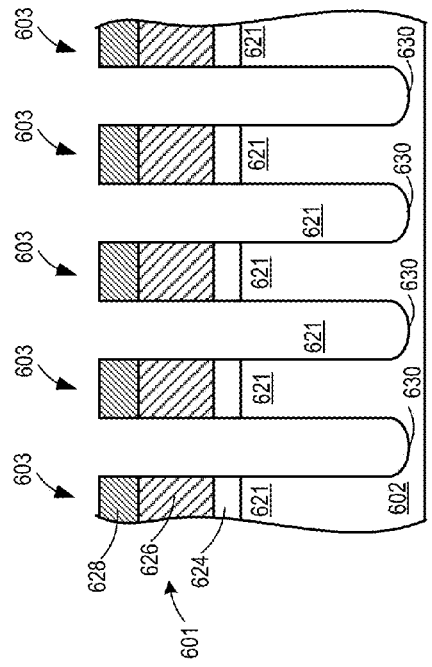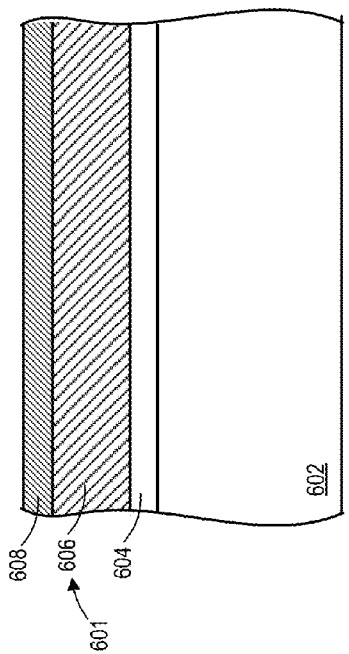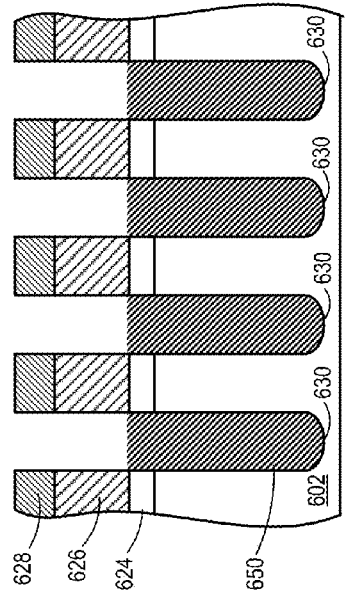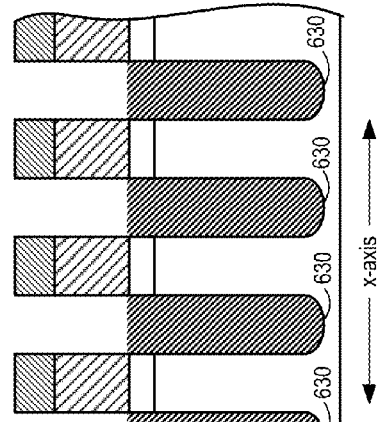

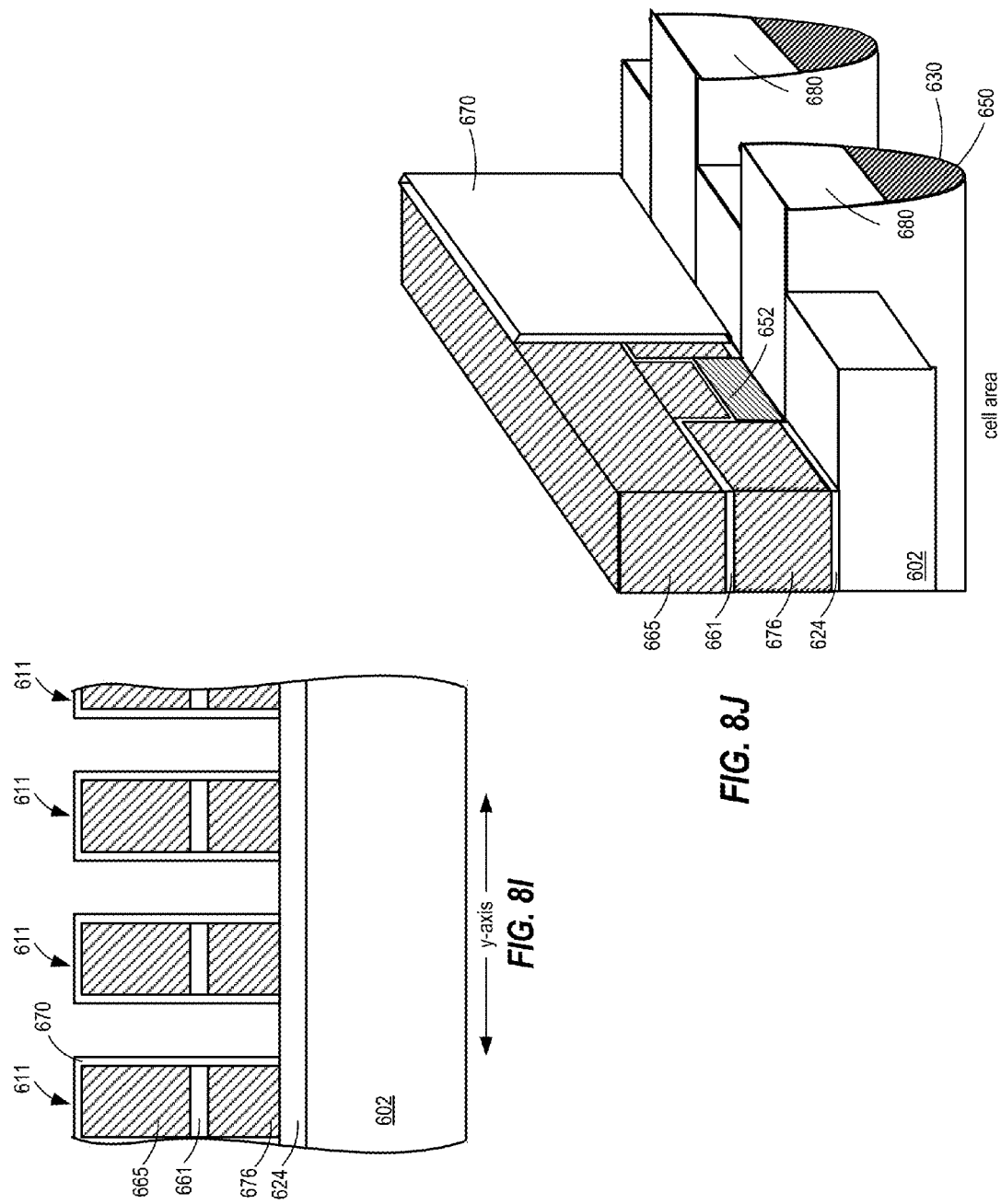

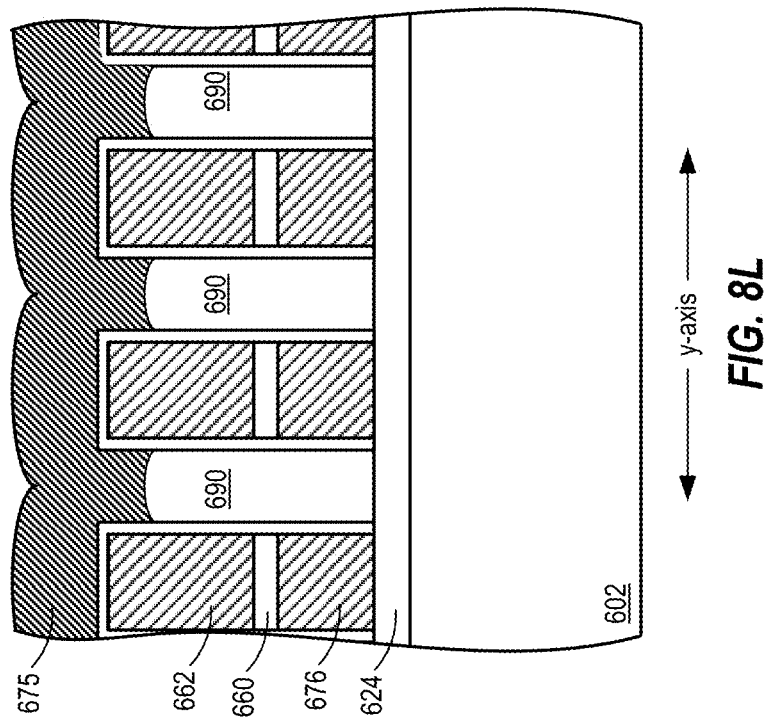
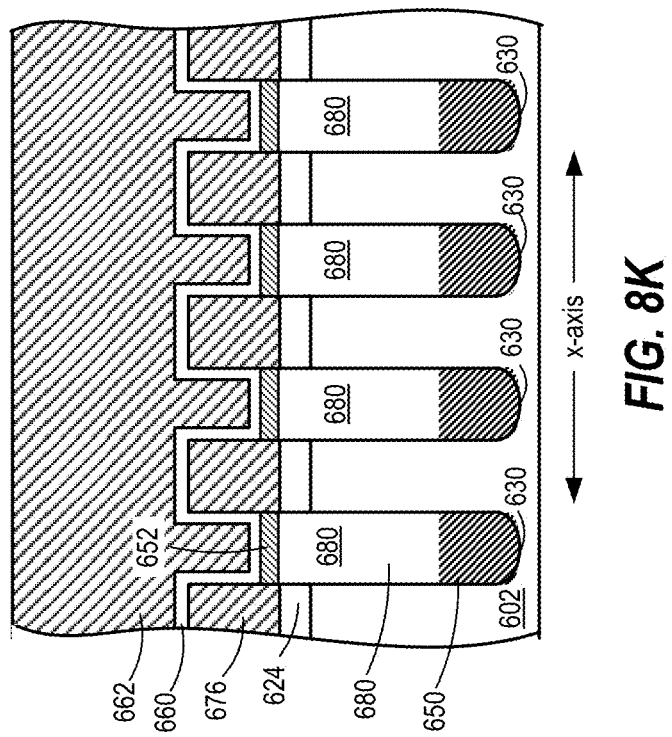

AIR GAP ISOLATION IN NON-VOLATILE MEMORY USING SACRIFICIAL FILMS

BACKGROUND OF THE INVENTION

1. Field of the Disclosure

Embodiments of the present disclosure are directed to high density semiconductor devices, such as non-volatile storage, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes.

BRIEF DESCRIPTION OF THE DRAWINGS

FIG. 1 is a top view of a NAND string.

FIG. 2 is an equivalent circuit diagram of the NAND string depicted in FIG. 1.

FIG. 3 is a plan view of a portion of a NAND flash memory array.

FIGS. 8A-8L are cross-sectional and perspective views of a portion of a non-volatile memory array that can be fabricated according to the method of FIG. 7 in one embodiment.

DETAILED DESCRIPTION

Figure 4:
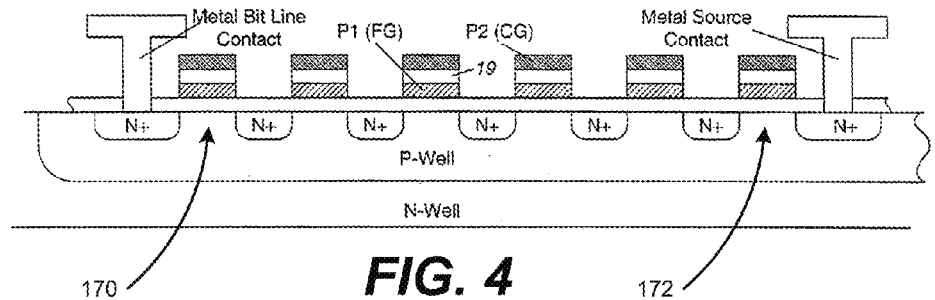
FIG. 4 is an orthogonal cross-sectional view taken along line A-A of the portion of the flash memory array depicted in FIG. 3.

Embodiments of the present disclosure are directed to high-density semiconductor memory arrays, and more particularly to electrical isolation between discrete devices in non-volatile memory using air gaps formed using sacrificial films of differing etch rates. A high etch rate material is formed in an isolation trench structure. Flowable chemical vapor deposition processes are used in one embodiment to form the higher etch rate film, followed by curing to increase the etch rate. A lower etch material is formed over the high etch rate material and provides a controlled etch back between charge storage regions in a row direction. A controlled etch back enables formation of a wrap-around dielectric and control gate structure in the row direction with minimized variability in the dimensions of the structures. At least a portion of the high etch rate material is removed to form air gaps in the bit line direction. Non-volatile memory arrays and related methods of fabrication are provided.

Air gaps formed in the column direction, referred to as bit line air gaps or shallow trench isolation (STI) air gaps, can provide electrical isolation between devices adjacent in the row direction. For example, adjacent columns of non-volatile storage elements, such as adjacent strings in a NAND type non-volatile memory, can be isolated using air gaps that are formed in the substrate between active areas underlying the adjacent columns. Although principally described with respect to NAND type non-volatile memory, it will be understood that the various air gaps described herein can be utilized in other arrays utilizing column and/or row arrangements for storage elements.

In one embodiment, air gaps are formed in the substrate between adjacent active areas of the substrate. Layer stack columns are formed over the substrate and isolation trenches are formed in the substrate between active areas underlying the layer stack columns. A first sacrificial film is formed at least partially in the isolation trenches. A second sacrificial film is formed over the first sacrificial film in between adjacent layer stack columns. The first sacrificial film has a higher etch rate than the second sacrificial film. The second sacrificial film is etched back and intermediate dielectric and control gate layers are formed. After etching to form layer stack rows, at least a portion of the first sacrificial film is removed to form an air gap in each isolation trench.

Flowable chemical vapor deposition processes are used to form silazane sacrificial films in one embodiment. The first sacrificial film can be formed of silazane using flowable chemical vapor deposition. The first sacrificial film is then cured or oxidized to form a high etch rate material that enables air gap formation. The lower etch rate second sacrificial film (e.g., oxide) can then be formed using traditional processes. The lower etch rate of the second sacrificial film permits controlled etching to reduce variability in etch back so that consistent device size and performance can be achieved.

In one embodiment, a single sacrificial film is formed using flowable chemical vapor deposition. After filling the isolation trenches and spaces between adjacent layer stack columns, this film is oxidized using oxygen and/or ozone oxidants. The gas in the chamber during oxidation is volatized and includes silicon. The reaction of the volatized gas causes an upper region of the sacrificial film to harden and densify. A lower region of the sacrificial film is constrained by the isolation trench dimensions and becomes porous with a high etch rate as a result of the oxidation.

An example of a NAND type of memory array that can be fabricated in accordance with embodiments of the present disclosure is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 19. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
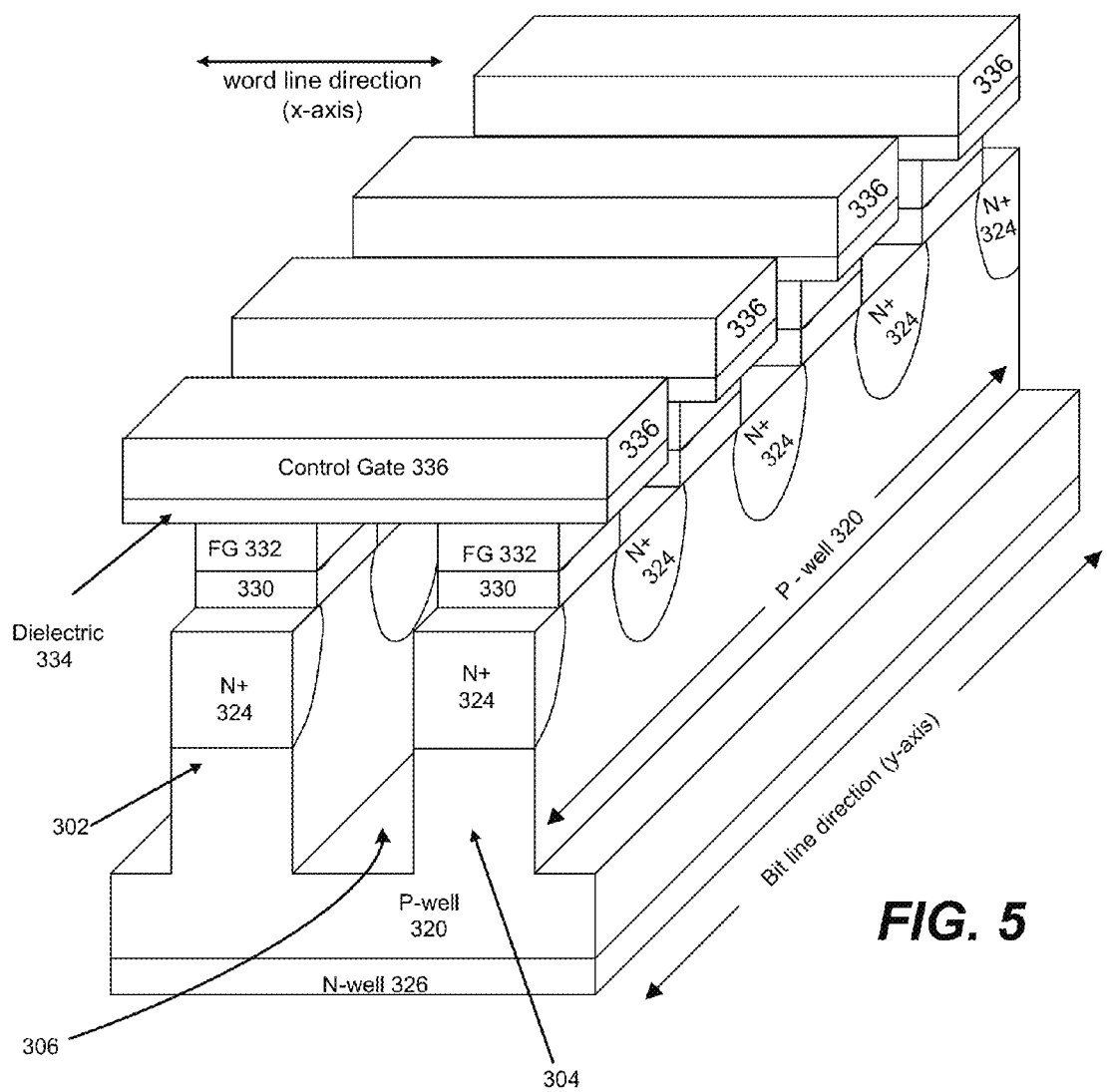
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate region 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by isolation area 306. Typically, an insulating material or dielectric is formed between adjacent NAND strings in this an isolation trench to form the isolation area 306.

In accordance with embodiments of the present disclosure, air gaps are introduced in the column (bit line) and/or row (word line) direction to form electrical isolation between closely spaced components in the memory structure. Air gaps can decrease parasitic interferences between neighboring charge storage regions (e.g., floating gates), neighboring control gates and/or between neighboring floating and control gates. Air gaps can enhance coupling and boost ratios for programming non-volatile memory. Air gaps can include various material compositions and need not correspond to atmospheric air. For example, concentrations of elemental gases may vary in the air gap regions. An air gap is simply a void where no solid material is formed in the semiconductor structure. An air gap has material formed beneath it to define a lower endpoint of the air gap and material above it to define an upper endpoint of the air gap.

Figure 6:
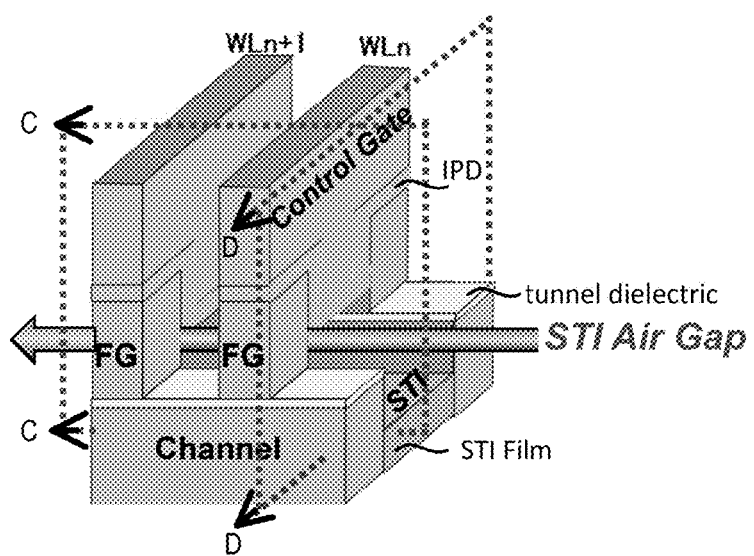
FIG. 6 is a three-dimension drawing showing a bit line or shallow trench isolation (STI) air gap as can be formed in one embodiment.

FIG. 6 depicts a portion of a non-volatile memory array having an air gap formed in a shallow trench isolation (STI) region extending in the column direction. The air gap extends in the column direction perpendicular to rows of memory cells including word lines WLn and WLn+1. In the vertical direction (perpendicular to the substrate surface), the air gap extends from above a first sacrificial film material (STI film) in the isolation region which defines a lower endpoint of the air gap. The air gap extends to the lower surface of the intermediate dielectric or IPD in the depicted example. In another example, the air gap extends to the lower surface of a second sacrificial film (not shown) that is introduced in the fabrication process to aid in establishing an air gap region.

Traditional sacrificial films may not be effectively removed to define adequate air gaps in the fabrication process. Wet reactive ion etching is typically used to etch columns of charge storage material, an intermediate dielectric layer and control gate layer into rows of individual charge storage regions and control gate lines. Wet reactive ion etching may not be effective at removing the STI fill where traditional sacrificial films are used or processes are used. Accordingly, insufficiently sized air gaps may be formed or the air gaps may fail to form at all.

Figure 7:
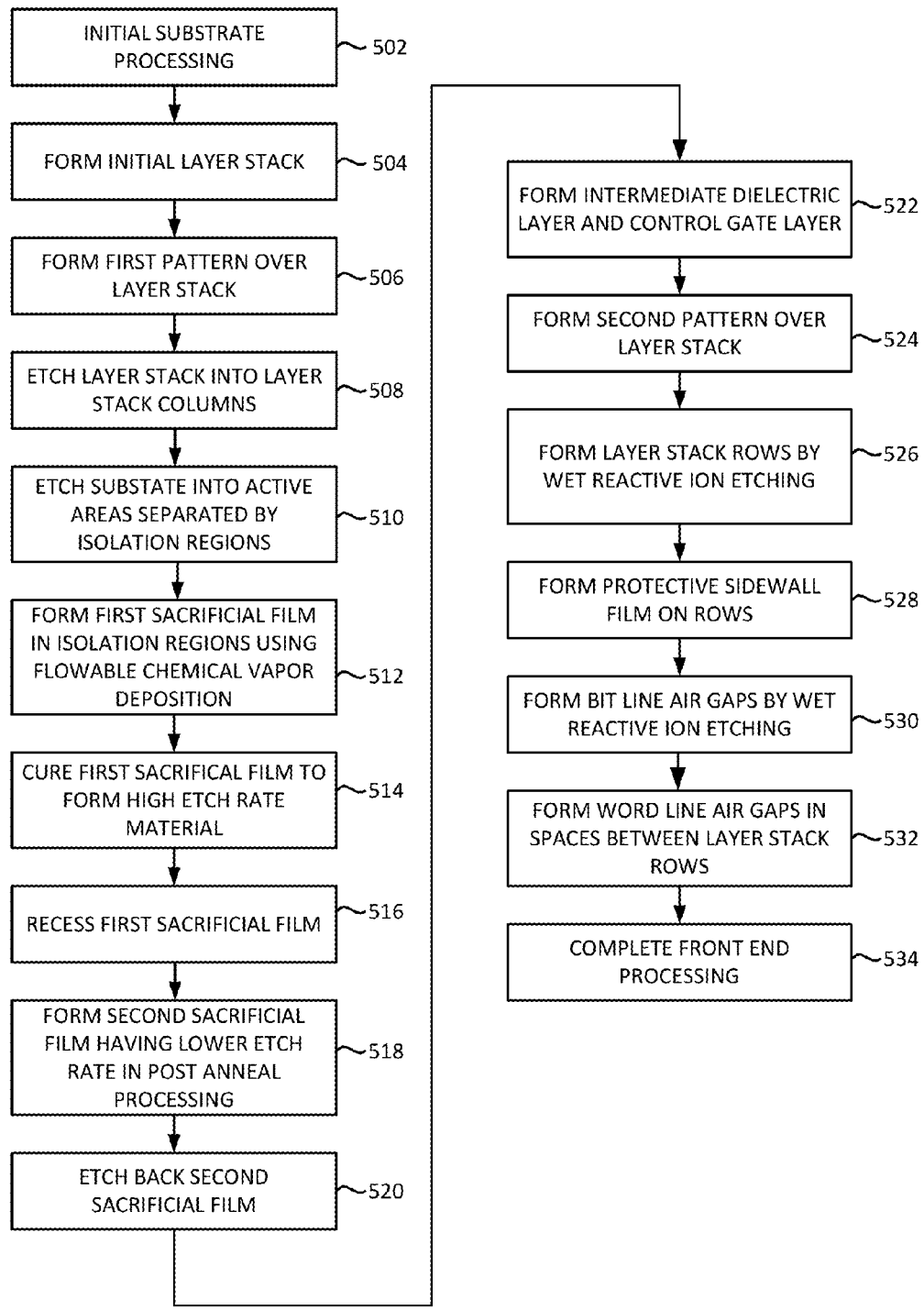
FIG. 7 is a flowchart describing a method of forming bit line air gaps using sacrificial films in accordance with one embodiment of the disclosure.

FIG. 7 is a flowchart describing a method of fabricating non-volatile storage with air gap isolation in accordance with one embodiment. FIGS. 8A-8M are orthogonal cross-sectional views of one example of a non-volatile memory array that can be fabricated according to the method in FIG. 7. Processing in the row or word line direction is first depicted, including the formation of active areas in the substrate, separated by isolation regions. Air gaps are formed in the bit line or column direction as part of the isolation regions. A first sacrificial film is formed using a flowable chemical vapor deposition process and curing to establish a high etching rate material in the isolation trenches. A second sacrificial film having a lower etch rate is formed to provide a controllable etch back process. The second sacrificial film is controllably etched back to permit the IPD and control gate to wrap around the floating gates FG, extending vertically between floating gates FG adjacent in the row direction (line D-D). The first sacrificial film is partially or fully removed when defining the control gates and charge storage regions from previously etched strips. The described embodiment is exemplary only and its precise form should not be taken as limiting the disclosure. The exact materials, dimensions and order of processing may vary according to the requirements of a given implementation. It is noted that the dimensions of the various features are not necessarily drawn to scale.

At step 502, initial processing is performed to prepare a substrate for memory fabrication. One or more wells (e.g., a triple well) are typically formed in the substrate prior to forming a layer stack over the substrate surface. For example, a p-type substrate may be used. Within the p-type substrate, an n-type well may be created and within the n-type well a p-type well may be created. Various units of a memory array may be formed within individual p-type wells. The well(s) can be implanted and annealed to dope the substrate. A zero layer formation step may also precede well formation.

At step 504, an initial layer stack is formed over the substrate surface. FIG. 8A is a cross-sectional view along the x-axis in the row or word line direction of a memory array showing a layer stack 601 formed over the surface of a substrate 602. In this example, layer stack 601 includes a tunnel dielectric layer (TDL) 604, a charge storage layer (CSL) 606, and one or more hard masking layer(s) (HML) 608. It is noted that a layer may be said to be over another layer when one or more layers are between the two layers as well as when the two layers are in direct contact.

The tunnel dielectric layer 604 is a thin layer of oxide (e.g., $SiO_2$) grown by thermal oxidation in one embodiment, although different materials and processes can be used. Chemical vapor deposition (CVD) processes, metal organic CVD processes, physical vapor deposition (PVD) processes, atomic layer deposition (ALD) processes, or other suitable techniques can be used to form the various layers described herein except where otherwise noted. In one example, the tunnel oxide layer is formed to a thickness of about 8 nanometers (nm). Although not shown, one or more high voltage gate dielectric regions may be formed at a peripheral circuitry region before or after forming the tunnel dielectric layer. The high voltage gate dielectric regions may be formed with a larger thickness (e.g., 30-40 nm) than the tunnel dielectric layer.

The charge storage layer 606 is a polysilicon floating gate layer in one embodiment. The vertical dimension (with respect to the substrate surface) or thickness of the charge storage layer can vary by embodiment. In one example, the charge storage layer has a vertical dimension of 30 nm. In another example, the charge storage layer has a vertical dimension of 50-80 nm.

Dielectric charge storage materials, metal and non-metal nanostructures (e.g., carbon) can also be used for the layer of charge storage material. In one embodiment, the charge storage layer is a metal layer forming a charge-trap type floating gate layer. A thin metal charge-trap type floating gate can reduce concerns with ballistic charge programming issues that may arise with conventional polysilicon floating gates. In one embodiment, a metal floating gate layer is formed to a thickness of between 10 nm and 20 nm. In another embodiment, metal thicknesses greater than 20 nm or less than 10 nm are used. In one embodiment, the metal floating gate layer is a high work function metal. In one example, the metal is ruthenium. Other metals such as titanium, tungsten, tantalum, nickel, cobalt, etc., and their alloys (e.g., TiN, WN, TaN, NiSi, CoSi, WSix) can be used. Hard masking layer(s) such as oxides or combinations of oxides and nitrides can be used in addition to other materials.

The layer stack is patterned at step 506. The first pattern applied at step 506 corresponds to intended columns of the memory array and may be repetitive in the row or direction of the x-axis. The pattern also corresponds to intended active areas of the substrate which will be separated by isolation regions. In one embodiment, conventional photolithography using photoresist is used to pattern the hard mask layer(s) into first mask including strips elongated in the direction of the y-axis with spaces between strips adjacent in the direction of the x-axis. The hard mask layer may be patterned into a first sub-pattern at the memory array area and one or more different sub-patterns at the peripheral circuitry areas to define active areas in the substrate with different dimensions in the direction of the x-axis. Spacer-assisted patterning, nano-imprint patterning, and other patterning techniques can also be used to form strips of the hard mask layer at reduced features sizes. The pattern, repetitive in the second or row direction, may define a first direction of etching to form columns of the targeted memory array.

After forming the pattern, the layer stack is etched at step 508 and the substrate is etched at step 510. The layer stack and substrate are both etched using the first pattern or mask formed in step 506. The layer stack is etched into layer stack columns. The substrate is etched into active areas which underlie the columns and isolation regions which separate the active areas. The term layer stack is used to refer to the layers formed over the substrate throughout processing. Thus, layer stack 601 may refer to the collection of layer stack columns that result from etching the initial layer stack. In one embodiment, reactive ion etching is used with various combinational etch chemistries to etch the different layers, however, any suitable etch can be used.

FIG. 8B depicts the memory array after etching in one example. Etching forms layer stack columns 603 that are elongated in the direction of the y-axis with spaces therebetween in the direction of the x-axis. Each layer stack column 603 includes a tunnel dielectric strip (TDS) 624, a charge storage strip (CSS) 626, and a mask strip (SS) 628. The substrate is etched to form isolation regions and active areas that underlie the layer stack columns. In FIG. 8B, isolation regions 630 are separated by active areas 621 under each layer stack column 603. In one example, the depth of the isolation regions in the substrate is 200 nm. Various depth can be used, for example, ranging from 150-220 nm in one embodiment.

At step 512, the isolation regions are filled with a first sacrificial film using a flowable chemical vapor deposition process. Using flowable chemical vapor deposition permits the formation of a material having a relatively high etch rate when compared with other processes. The flowable CVD further provides the base for a subsequent curing process to increase the etch rate of the sacrificial film above its initial formation rate. In one embodiment, the first sacrificial film is a silazane formed using a flowable CVD process. In the flowable CVD process, a liquid precursor flows or is filled into the isolation trenches where it reacts to form the deposited film. Unlike conventional deposition processes, the film is formed from the bottom of the isolation trench upwards, filling the trenches to a desired depth.

The silazane formed in step 512 may be contrasted with an undensified polysilazane, for example, as formed in a spin-on process. Unlike a polysilazane or other material formed in a spin-on process, the silazane formed by a flowable CVD process does not include carbon. The organic solvents used in spin-on processes contain carbon. These films may exhibit a lower etch rate when compared with the silazane formed at step 512 in a flowable CVD process. Additionally, the use of a flowable CVD process enables subsequent curing to further increase the etch rate of the first sacrificial film.

At step 514, the first sacrificial film is cured to increase the etch rate of the material. Step 516 includes curing a silazane first sacrificial film using molecular oxygen O2 and/or ozone O3 (trioxygen) in one embodiment. The oxidation of the silazane increases its etch rate. In one example, the narrow feature size of the isolation trench does not permit shrinking of the first sacrificial film in this region. This can form a porous silazane sacrificial film having a high etch rate.

In one embodiment, the curing process at step 514 includes controlling the substrate temperature to above 300 degrees Celsius and controlling the pressure of the CVD chamber at lower than 600 Torr. In another example, the temperature is maintained between 300 degrees Celsius and 500 degrees Celsius and the pressure is maintained between 1 Torr and 600 Torr. These operating constraints have been discovered to allow the flowable CVD film to have a higher etch rate and be removed more effectively in later wet etch processing to form bit line air gaps.

The first sacrificial material is formed in the isolation regions as well as the spaces between adjacent layer stack columns. The fill material can be planarized, such as by chemical mechanical polishing (CMP) or etch back, resulting in the structure shown in FIG. 8C including first sacrificial film 650. A dielectric liner may be formed before the fill material in other embodiments. For example, a thermally grown oxide such as can be formed using direct partial oxidation or a high temperature oxide (HTO) may be used.

At step 516, the first sacrificial material is recessed. FIG. 8D depicts the results of step 516 in one embodiment. Wet etching or dry reactive ion etching may be used to recess the first sacrificial film 650. The sacrificial material may be recessed to different depths in the spaces between layer stack columns. In one example, the first sacrificial material is recessed to about the level of the upper surface of the tunnel dielectric layer. The first sacrificial material may be recessed further, for example to about the level of the substrate surface or, or less, for example to somewhere above the lower surface of the charge storage region.

Figure 8F:
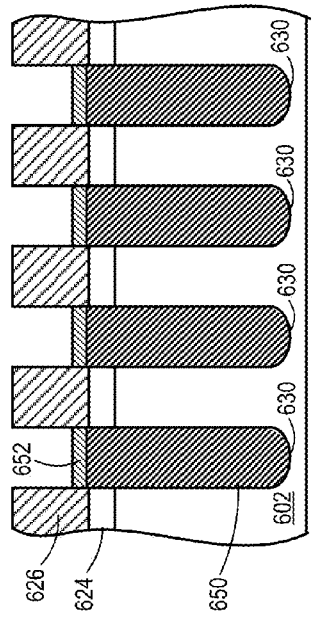

At step 518, a second sacrificial film is formed during post anneal processing of the first sacrificial film. The second sacrificial film completes filling of any remaining space in the isolation trenches and between adjacent layer stack columns that results after etch back of the first sacrificial film. FIG. 8E depicts the results of step 518 in one embodiment. The second sacrificial film has a lower etch rate than the first sacrificial film. The second sacrificial film is an oxide in one example although other materials may be used. Oxidation can be used to grow the second sacrificial film or it may be deposited in corresponding processes. Traditional oxides or more advanced high temperature oxides and the like may be used.

At step 520, the second sacrificial film is recessed below the upper surface of the charge storage regions. Dry reactive ion etching is used in one embodiment to controllably recess the lower etch rate second sacrificial film although other suitable processes may be used. FIG. 8F depicts the results of step 520 in one example. In this example, some amount of the second sacrificial film 652 remains but in other examples, all of film 652 may be removed. The lower etch rate of film 652 permits a controlled dry etch process to reduce variability in the distance between the upper surface of the second sacrificial film 652 and the substrate surface after etch back. Variability may occur if a high etch rate film is used at step 520. For example, using a single sacrificial layer with a high etch rate to permit subsequent removal for forming bit line air gaps may result in high variability in the etch back at step 520. If a high level of variability exists, the subsequently formed intermediate dielectric layer will exhibit unequal coverage over the charge storage regions which may affect device behavior. For example, the operating characteristics of individual rows or columns of storage elements may be affected. The distance between the upper surface of the second sacrificial film and the surface of the substrate may vary by embodiment. In one example, the distance ranges from 10 nanometers to 30 nanometers although other distances may be used.

At step 522, an intermediate dielectric layer and control gate layer are formed. The intermediate dielectric layer is a triple layer of oxide, nitride and oxide (ONO) in one embodiment having a thickness of about 9-12 nm, although various materials and thicknesses may be used. In one embodiment, a high-K (dielectric constant) material is used for the intermediate dielectric to reduce or eliminate charge transfer through the intermediate layer while providing enhanced control gate to floating gate coupling. The control gate layer is polysilicon in one embodiment. The polysilicon can be doped in-situ or after formation. In another embodiment, the control gate layer is formed at least partially of a metal. In one example, the control gate layer has a lower portion that is formed from polysilicon and an upper portion that is formed from metal. A barrier layer may be formed between the polysilicon and the metal, to prevent silicidation. The control gate layer can include, by way of example (from layers to upper layers as move away from substrate surface): a barrier metal and metal; a barrier metal, polysilicon and silicide; a barrier metal and silicide (e.g., FUSI); polysilicon, a barrier metal and metal. Barrier metals may include, but are not limited to, Ti, TiN, WN and TaN or a combination with related alloys that have a suitable electron work function. Metals may include, but are not limited to, W, WSix or other similar low resistivity metals. Silicides may include, but are not limited to, NiSi, CoSi. In one example, the control gate layer is polysilicon that is subjected to silicidation after being etched into control gates so as to form a partially or fully-silicided control gate structures. The control gate layer may be formed by chemical vapor deposition (CVD), atomic layer deposition (ALD), plating, or another technique.

Figure 8H:
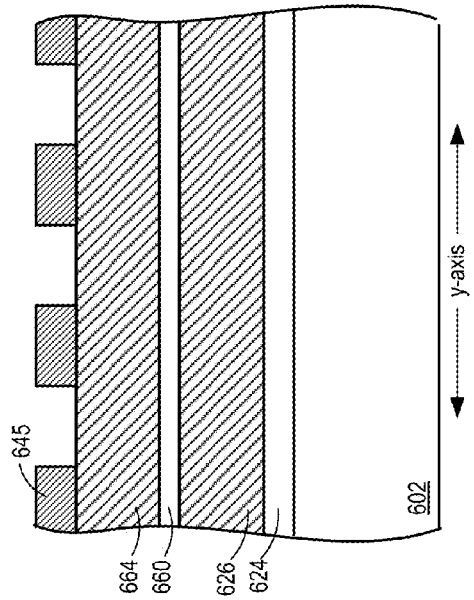
Figure 8E:
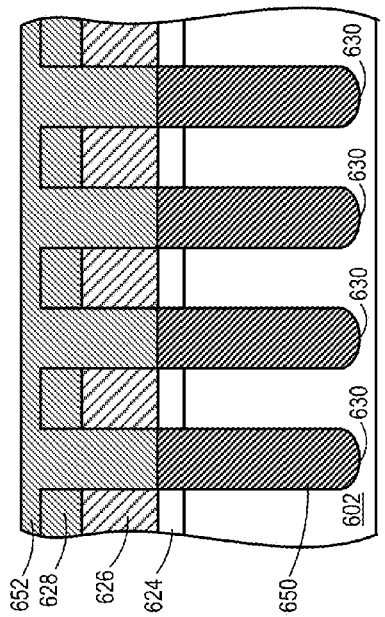
Figure 8G:
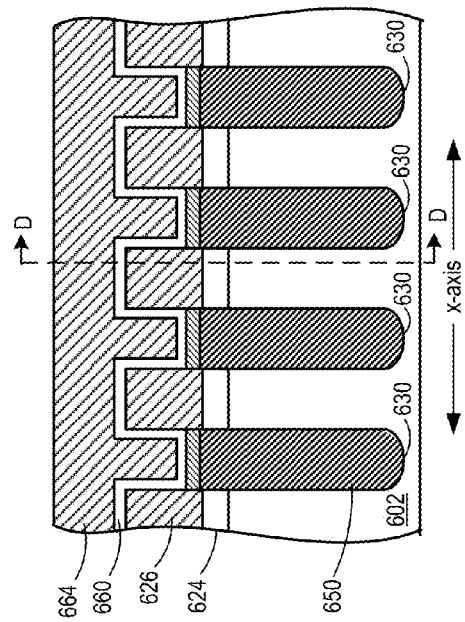

FIG. 8G depicts the results of 522 in one embodiment. Intermediate dielectric layer 660 is formed over the substrate. A conformal deposition process is used in this example so that the intermediate dielectric layer is formed to a substantially even thickness along the sidewalls and upper surface of each charge storage strip 626. Control gate layer 664 is formed over the intermediate dielectric layer 660. The control gate layer is a layer of polysilicon in one example, formed to a depth of about 100 nm, although various materials (e.g., metal) can be used and formed to different thicknesses. The etch back of the second sacrificial film provides a low variability in the formation of the intermediate dielectric layer. As illustrated, the intermediate dielectric layer extends vertically toward the substrate surface, wrapping around each strip 626 of charge storage material and permitting the control gate layer to extend vertically between adjacent strips of charge storage material. This structure enables enhanced coupling.

At step 524, a second pattern is formed over the layer stack. The second pattern is formed for etching orthogonal to the direction of etching using the first pattern. The second pattern may include strips of hard masking material and/or photoresist, or other suitable mask, that are elongated in the row direction along the x-axis with a spacing between strips in the column direction along the y-axis. The pattern can be used to define the gate length for the charge storage region of each memory cell.

FIG. 8H is a cross-sectional view taken along line D-D of FIG. 8G, depicting the device in cross-section in the direction of the y-axis or bit line direction. FIG. 8H depicts the results of step 524 after forming the second pattern. Over the control gate layer 664 is formed strips 645 of photoresist or another patterning agent. One or more hard masking layers (not shown) may be formed over the control gate layer before forming the strips. In one embodiment, the strips correspond to intended column dimensions for the control gates and charge storage regions. In another example, the strips may be used to form spacers for a double patterning process. Etching according to the second pattern will be used to define the gate length of the charge storage regions and select gate regions extending in the column or bit line direction. Although a pattern is only shown for the cell area, the pattern will be formed at the select gate area as well to etch the select gate regions. The pattern may include wider (larger dimension in the column direction) strips at the select gate area to form larger gate lengths.

At step 526, the layer stack is etched into layer stack rows. In one embodiment, etching the layer stack includes etching strips of the tunnel dielectric material. In another embodiment, the tunnel dielectric is not etched. Reactive ion or another suitable etch process may be used. One or more etch chemistries may be applied to etch through the various layers of the stack.

FIG. 8I depicts the results of step 526 in one example. Etching continues until reaching the tunnel dielectric layer in this example. In other examples, etching may continue until reaching the substrate surface. In another example, some portion of the tunnel dielectric layer is etched without completely etching through the layer. Etching forms layer stack rows 611. The control gate layer is etched into control gates (CG) 665. In one embodiment, the control gates 665 form word lines. The intermediate dielectric layer 660 is etched into intermediate dielectric strips 661. The charge storage strips 626 are etched into individual charge storage regions (CSR) or floating gates 676.

At step 528, a protective sidewall film is formed along the vertical sidewalls of the layer stack rows. Different films may be used in different implementations. In one example, an oxide can be deposited and etched back to form sidewall films along the sidewalls of the individual layer stack rows. Traditional spacer formation processes may be used. FIG. 8I depicts a protective sidewall spacer 670 that is formed along the sidewall (extending in the word line direction) of one of the layer stack rows. The sidewall spacer is depicted as only partially extending along the sidewall in the x-axis direction for clarity. The spacer will actually extend fully along the length of each layer stack row. Each layer stack row will include two sidewall spacers, with one on each vertical sidewall. After protective sidewall film deposition, an implant process can be performed to create n+ source/drain regions. In one embodiment, the n+ source/drain regions are created by implanting n-type dopants such as arsenic or phosphorus into the p-well.

The sidewall spacers will protect each layer stack row during subsequent processing steps. In one embodiment, the spacer material is chosen for its etch selectivity with respect to the sacrificial film 650. In this manner, the sacrificial film can later be removed in processes where the layer stack sidewalls are not exposed to the various etch chemistries. This will protect the sidewalls of the control gate layer and charge storage layer as well at the various dielectric layers.

FIG. 8J is a perspective view of the memory array depicting the point in processing shown in the cross-sectional views of FIG. 8I. Protective dielectric liner 670 is formed along the sidewall of one of the layer stack rows 611. The liner 670 is depicted as only partially extending along the sidewall in the x-axis direction for clarity. The spacer will actually extend fully along the length of each layer stack row. Each layer stack row will include liners 670 on each vertical sidewall.

FIG. 8J illustrates that etching back the liner material exposes the sacrificial material 650 in trenches 630. A portion of an upper surface of the sacrificial material corresponding to the spaces between adjacent layer stack rows is exposed. This allows subsequent processing to remove the sacrificial material in order to form an air gap in the bit line direction.

At step 530, the sacrificial material is removed to form the bit line air gaps. A wet etch chemistry is used in one embodiment, although other suitable reactive ion etch (RIE) processes (e.g., dry) can be used. The etch process is selective for the sacrificial film so that it can be removed without removing any liners in the isolation regions or the sidewalls spacers on the layer stack rows.

FIG. 8J depicts the results of step 530. FIG. 8K is a cross-sectional view along the direction of the x-axis, also depicting the results of step 530. Sacrificial material 652 has been removed from isolation regions 630 and the areas between layer stack columns. Etching removes the film from the isolation regions, beginning with the material exposed by etching back liner 670. A wet etch process is used in one embodiment, although other suitable etch processes can be used. As earlier described, the etch process is selective for the sacrificial film so that it can be removed without removing any liners in the isolation regions and the sidewalls spacers on the layer stack rows. Etching will also remove the sacrificial material in the isolation regions that underlies the layer stack rows. Etching will begin attacking the sacrificial material from the side under the rows after etching proceeds vertically down into the isolation regions. Etching will further continue behind the liner to remove portions of the sacrificial material that extend above the isolation regions and substrate surface. Etching removes the material between charge storage regions and intermediate dielectric that are adjacent in the word line or row direction. Some of the sacrificial material may not be removed. Thus, removing the sacrificial material does not necessarily have to include removing all of the material.

Removing the sacrificial material forms air gaps 680. The air gaps are elongated in the column direction in the isolation regions 630. The air gaps extend from below the surface of the substrate to the level of the upper surface of the intermediate dielectric regions. As earlier described, the air gaps may have different vertical dimensions in different embodiments. The air gaps may not extend as deep within isolation regions and may not extend as far above the substrate surface. Further, the air gaps may be formed exclusively within the isolation regions or exclusively between adjacent layer stack columns in other examples.

At step 532, air gaps are formed at least partially in the spaces between the layer stack rows. The air gaps are elongated in the x-direction. They extend in the x-direction to provide electrical isolation or shielding between elements of adjacent layer stack rows. The vertical dimension and column dimension (along y-axis) of the air gaps can vary to meet the particular requirements of a given implementation.

FIG. 8L is a cross-sectional view in the direction of the y-axis depicting the results of step 532 in one embodiment. A capping layer 675 is formed over the layer stack rows using a non-conformal deposition process. A dielectric liner (e.g., oxide) is formed along the sidewalls and over the layer stack rows. Capping layer 675 accumulates by using a non-conformal deposition process and meets at a location over the spaces between rows to form air gaps 690 that are elongated in the x-direction. Material 675 extends vertically toward the substrate surface along the liner on a portion of the vertical sidewalls of the layer stack rows. The amount of this vertical dimension will define an upper endpoint of the air gaps at a lower surface of material 675. In this example, it is seen that the air gap extends vertically beyond the level of the upper surface of control gate strips 662. Although not shown, some portion of dielectric 675 may enter the spaces between rows. This portion of the dielectric may raise the lower endpoint of the air gap. Any accumulation will be minor and only decrease the size of the air gap minimally. Although not shown, a polishing step can be applied to form individual caps from layer 675. The capping layer can be polished to form plugs sealing the word line air gaps. A planar surface can be created for further processing steps. The vertical dimension (with respect to substrate surface) and row dimension (along x-axis) of the air gaps can vary to meet the particular requirements (e.g., suitable isolation parameters) of a given implementation.

At step 534, front end processing is completed. In one example, step 534 may include interconnecting the floating gate and control gate regions of select and peripheral circuitry transistors. Peripheral gate connections can be formed using vias or contact holes, etc. to form contacts to individual gate regions or to connect multiple transistors to a common control line. The select gate transistors can have their floating gate regions shorted to the control gate regions to form a single gate structure. Array connections can also be patterned and formed. After forming contacts, etc., further backend processing to form metal layers, etc. to complete the device according to known techniques can be performed. Various backend processes can be performed to finalize fabrication of the array. For example, a passivation dielectric layer can be deposited, followed by forming metal conductive lines and vias to connect the lines with source and drain regions at the end of the memory cell strings, etc.

Figure 9:
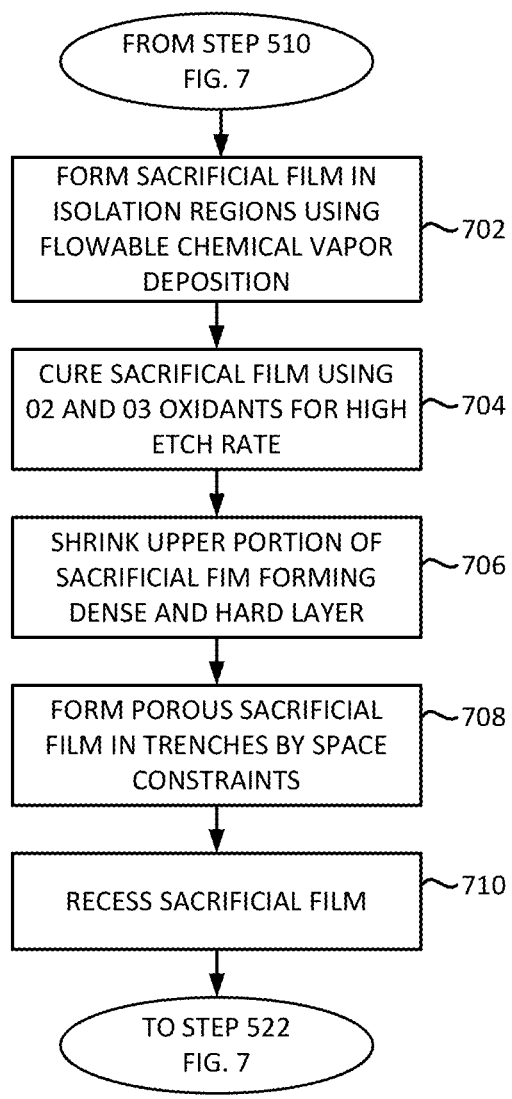
FIG. 9 is a flowchart describing a method of forming bit line air gaps using sacrificial films in accordance with one embodiment of the disclosure.

FIG. 9 is a flowchart describing another embodiment of fabricating a non-volatile memory array including bit line air gaps in accordance with the disclosure. In this embodiment the first sacrificial film completely fills the isolation regions and spaces between layer stack columns when cured to form differing etch rate materials.

Figure 10A:
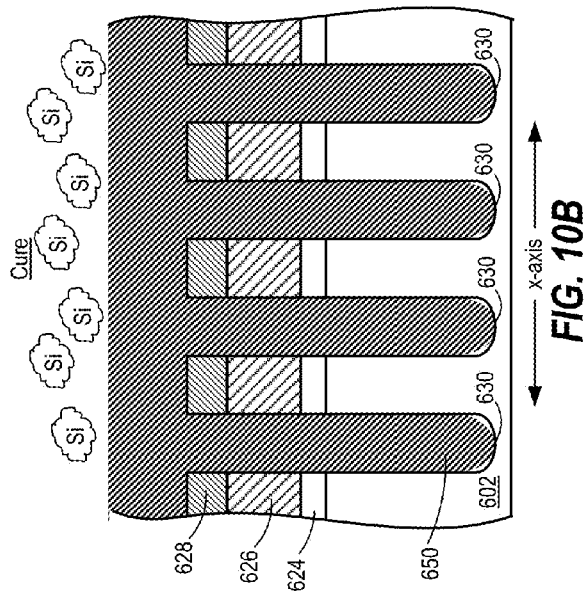
FIGS. 10A-10C are cross-sectional views of a portion of a non-volatile memory array that can be fabricated according to the method of FIG. 9 in one embodiment.

Processing begins as described in steps 502-510 of FIG. 7 to form layer stack columns and isolation trenches. After etching the substrate, a sacrificial film is formed using a flowable CVD process at step 702. In this embodiment, the sacrificial film 650 completely fills the isolation regions and the spaces between adjacent layer stack columns. FIG. 10A is a cross-sectional view depicting the results of step 702 is one embodiment. The sacrificial film has been overfilled, overlying the hard mark strips 628.

Figure 10B:
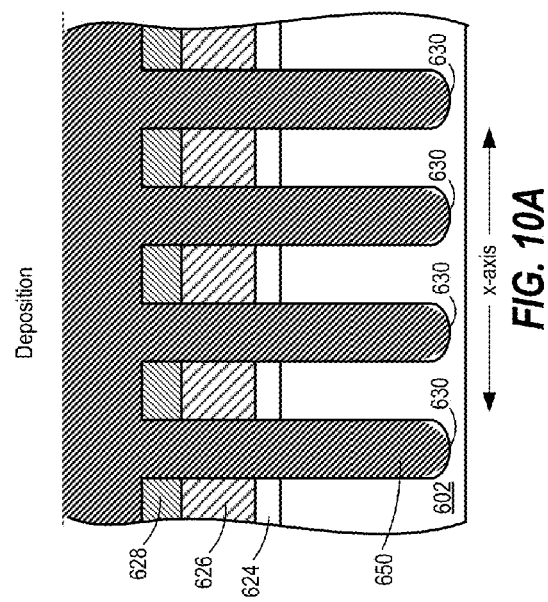
Figure 10C:
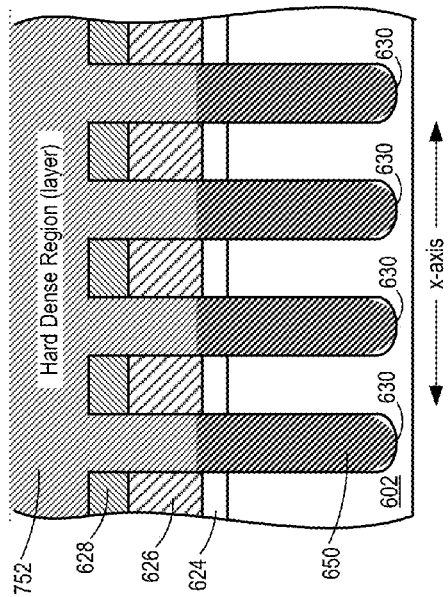

At step 704, the sacrificial film is oxidized by O2 and O3 to cure the silazane sacrificial material. FIG. 10B depicts the cure process for step 704 in one embodiment. The oxidation process generates a volatized gas including silicon. As a result of oxidized curing, the upper portion of the sacrificial film reduces size or shrinks at step 706. The reduced size of this upper portion of the sacrificial film creates a dense and hard layer from the sacrificial film as illustrated in FIG. 10C. Although shown as a distinct hard dense layer 752, the curing and oxidation may result in a graduated material having an increasing etch rate the further the material is from the upper surface of the layer stack. The curing also forms a porous sacrificial film in the lower portion of the sacrificial film at step 708. The small narrow isolation trench prevents the sacrificial film from shrinking in the substrate. Accordingly, the oxidation causes the film at this region to become porous and have a higher etch rate compared with the upper portion of the sacrificial film at step 536.

At step, the first sacrificial film 710 is recessed. The hard densified upper portion has a low etch rate. This permits a controlled process to reduce any variability in the distance between the lower surface of the sacrificial film and the substrate surface. After recessing the sacrificial film, processing continues as described at step 522 of FIG. 7 to form an intermediate dielectric layer and control gate layer.

Figure 11:
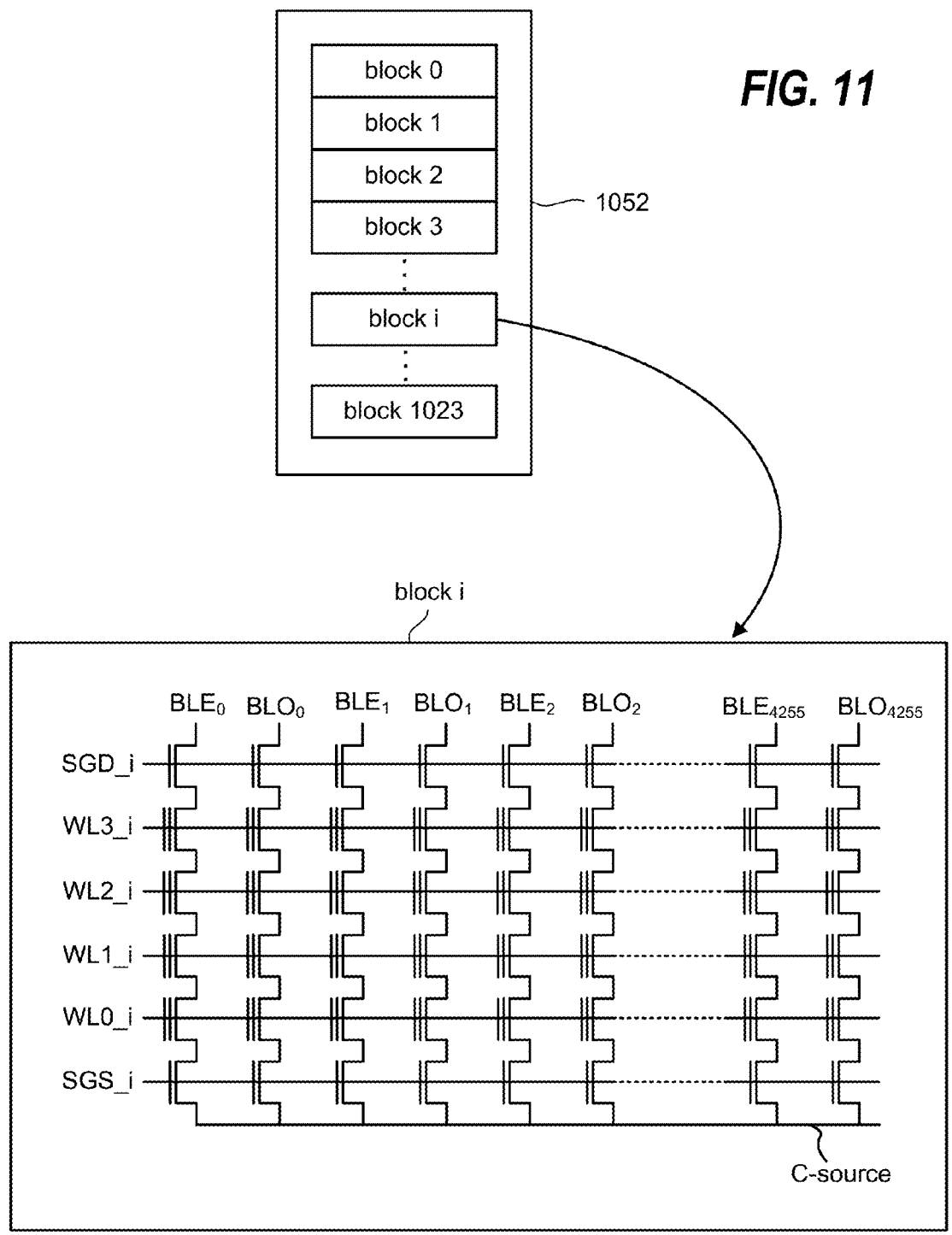
FIG. 11 depicts an example of the organization of a memory array in accordance with one embodiment.

FIG. 11 depicts an exemplary structure of a memory cell array 1052 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 11 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 12:
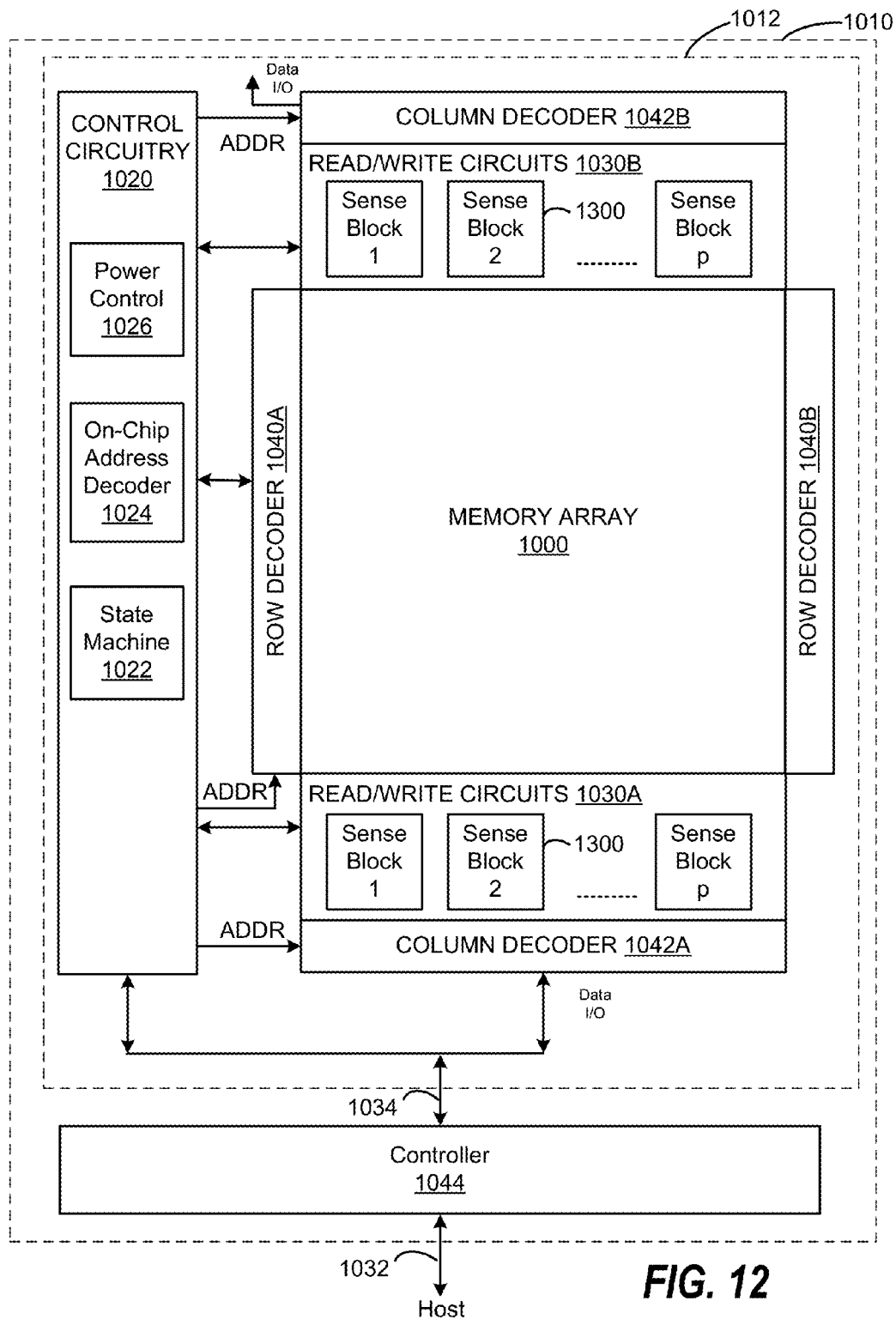
FIG. 12 is a block diagram depicting an example of a memory system that can be fabricated or used to implement embodiments of the disclosed technology.

FIG. 12 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 13:
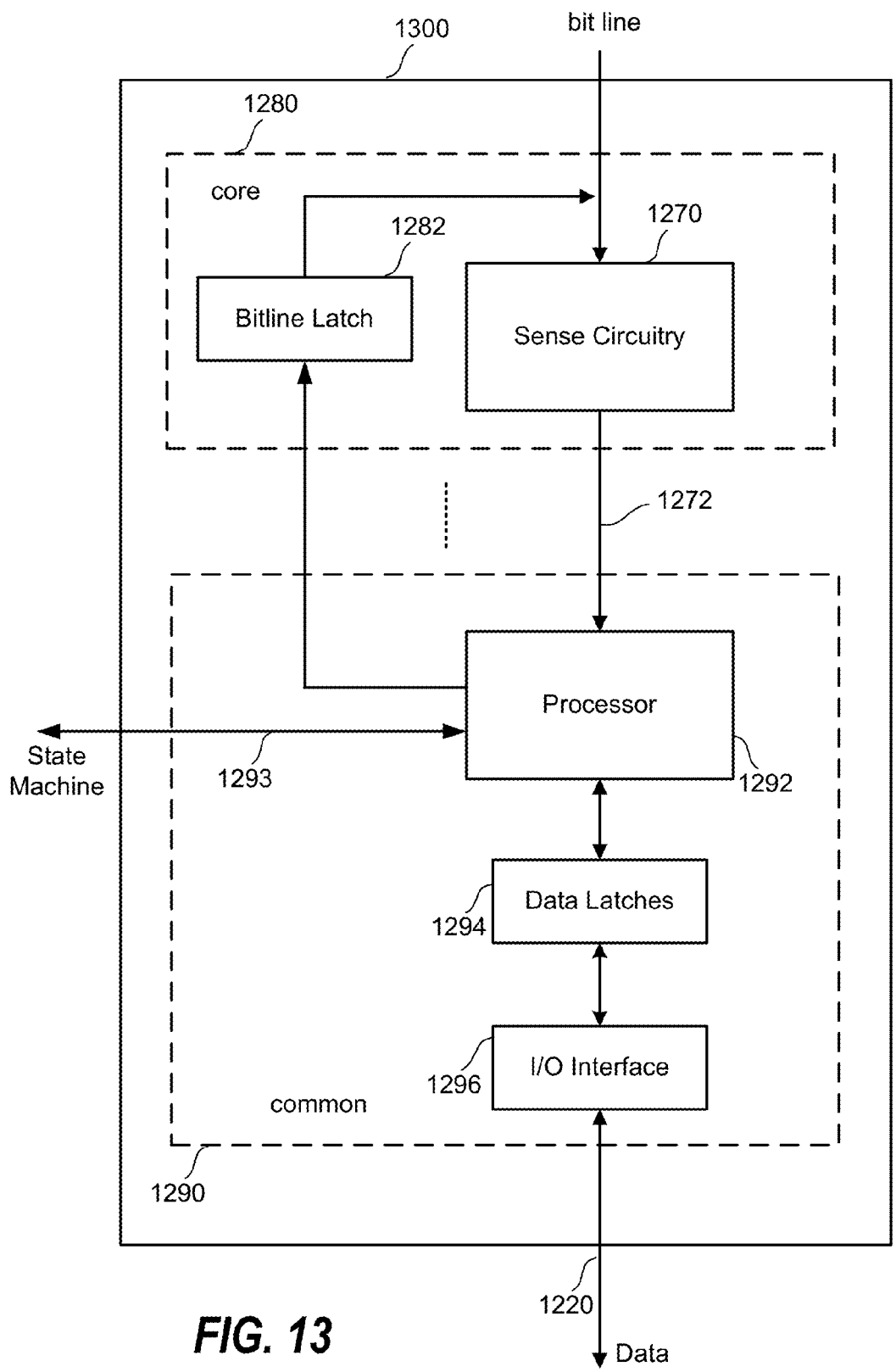
FIG. 13 is a block diagram depicting one embodiment of a sense block.

FIG. 13 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

Various features and techniques have been presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

A method of fabricating non-volatile storage is provided in one embodiment that includes forming a plurality of layer stack columns over a substrate and a plurality of isolation trenches in the substrate separating adjacent active areas. Each active area of the substrate underlies one layer stack column, and each layer stack column includes a strip of charge storage material separated from the substrate by a strip of dielectric material. The method includes forming a first sacrificial film at least partially in the plurality of isolation trenches and a second sacrificial film over the first sacrificial film at least partially between adjacent layer stack columns. The first sacrificial film has a first etch rate and the second sacrificial film has a second etch rate that is lower than the first etch rate. The method includes etching back the second sacrificial film, forming an intermediate dielectric layer and a control gate layer after etching back the second sacrificial film, etching orthogonally to the layer stack columns to form a plurality of layer stack rows. Each layer stack row includes a control gate etched from the control gate layer that extends over a row of charge storage regions from the strips of charge storage material. Etching orthogonally to the layer stack columns includes removing at least a portion of the first sacrificial film to form a bit line air gap at least partially in each isolation trench.

A non-volatile memory array is provided in one embodiment that includes a plurality of non-volatile storage elements arranged into rows and columns above a surface of a substrate. Each non-volatile storage element includes a charge storage region. The array includes a plurality of isolation trenches formed in the substrate between active areas, a first sacrificial film formed at least partially in each isolation trench. The first sacrificial film has a first etch rate and an upper surface. The array includes a second sacrificial film formed at least partially between adjacent charge storage regions in each row. The second sacrificial film has a lower surface and a second etch rate that is lower than the first etch rate. An air gap is formed in each isolation trench. The air gaps have a lower endpoint defined by the upper surface of the first sacrificial film and an upper endpoint defined by the lower surface of the second sacrificial film.

A method of fabricating non-volatile storage in one embodiment includes forming a plurality of layer stack columns over a substrate and a plurality of isolation trenches in the substrate separating adjacent active areas. Each active area of the substrate underlies one layer stack column, and each layer stack column has a strip of charge storage material separated from the substrate by a strip of dielectric material. The method includes filling each isolation trench and a space between adjacent layer stack columns with a sacrificial film using flowable chemical vapor deposition, oxidizing the sacrificial film to harden an upper region of the sacrificial film while increasing an etch rate of a lower region of the sacrificial film, etching back the sacrificial film, forming an intermediate dielectric layer and a control gate layer after etching back the sacrificial film, and etching orthogonally to the layer stack columns to form a plurality of layer stack rows. Each layer stack row includes a control gate etched from the control gate layer that extends over a row of charge storage regions from the strips of charge storage material. Etching orthogonally to the layer stack columns includes removing at least a portion of the lower region of the sacrificial film to form a bit line air gap at least partially in each isolation trench.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile storage, comprising:
    forming a plurality of layer stack columns over a substrate and a plurality of isolation trenches in the substrate separating adjacent active areas, each active area of the substrate underlying one layer stack column, each layer stack column having a strip of charge storage material separated from the substrate by a strip of dielectric material;
    forming a first sacrificial film at least partially in the plurality of isolation trenches and a second sacrificial film over the first sacrificial film at least partially between adjacent layer stack columns, the first sacrificial film having a first etch rate and the second sacrificial film having a second etch rate that is lower than the first etch rate;
    etching back the second sacrificial film;
    forming an intermediate dielectric layer and a control gate layer after etching back the second sacrificial film; and
    etching orthogonally to the layer stack columns to form a plurality of layer stack rows, each layer stack row including a control gate etched from the control gate layer that extends over a row of charge storage regions from the strips of charge storage material;
    wherein etching orthogonally to the layer stack columns includes removing at least a portion of the first sacrificial film to form a bit line air gap at least partially in each isolation trench.

2. A method according to claim 1, further comprising:
    forming a plurality of word line air gaps between adjacent layer stack rows.

3. A method according to claim 1, wherein:
    the second sacrificial film is formed over the first sacrificial film after etching back the first sacrificial film.

4. A method according to claim 1, wherein:
    the plurality of layer stack columns are part of a three-dimensional non-volatile memory array.

5. A method according to claim 1, wherein forming the first sacrificial film includes a flowable chemical vapor deposition process.

6. A method according to claim 5, further comprising:
    curing the first sacrificial film using one or more of oxygen and ozone oxidants to increase the first etch rate.

7. A method according to claim 6, further comprising:
    controlling a temperature of the substrate during the curing of the first sacrificial film to at least three hundred degrees Celsius.

8. A method according to claim 7, further comprising:
    controlling a process pressure at six hundred Torr or less during the curing of the first sacrificial film.

9. A method according to claim 1, wherein:
    etching back the second sacrificial film includes removing at least a portion of the second sacrificial film.

10. A method according to claim 9, wherein:
    etching back the second sacrificial film includes removing all of the second sacrificial film.

11. A method of fabricating non-volatile storage, comprising:
    forming a plurality of layer stack columns over a substrate and a plurality of isolation trenches in the substrate separating adjacent active areas, each active area of the substrate underlying one layer stack column, each layer stack column having a strip of charge storage material separated from the substrate by a strip of dielectric material;
    filling each isolation trench and a space between adjacent layer stack columns with a sacrificial film using flowable chemical vapor deposition;
    oxidizing the sacrificial film to harden an upper region of the sacrificial film while increasing an etch rate of a lower region of the sacrificial film;
    etching back the sacrificial film;
    forming an intermediate dielectric layer and a control gate layer after etching back the sacrificial film; and
    etching orthogonally to the layer stack columns to form a plurality of layer stack rows, each layer stack row including a control gate etched from the control gate layer that extends over a row of charge storage regions from the strips of charge storage material;
    wherein etching orthogonally to the layer stack columns includes removing at least a portion of the lower region of the sacrificial film while maintaining at least a portion of the upper region of the sacrificial film to form a bit line air gap at least partially in each isolation trench, the bit line air gap having an upper endpoint underlying the layer stack rows that is defined by a lower surface of the upper region of the sacrificial film.

12. A method according to claim 11, wherein:
    the at least a portion of the upper region of the sacrificial film is a first portion of the upper region of the sacrificial film;
    etching back the sacrificial film includes removing a second portion of the upper region of the sacrificial film.

13. A method according to claim 11, wherein oxidizing the sacrificial film includes:
    curing the sacrificial film using one or more of oxygen and ozone oxidants to increase the etch rate of the lower region of the sacrificial film.

14. A method according to claim 13, further comprising:
    controlling a temperature of the substrate during the curing of the first sacrificial film to at least three hundred degrees Celsius.

15. A method according to claim 14, further comprising:
    controlling a process pressure at six hundred Torr or less during the curing of the first sacrificial film.

16. A method according to claim 11, wherein:
    the lower region of the sacrificial film is formed at least partially in each isolation trench;
    the upper region of the sacrificial film is formed at least partially in the space between adjacent layer stack columns.

17. A method of fabricating non-volatile storage, comprising:
    etching a layer stack into a plurality of layer stack columns over a substrate, each layer stack column including a strip of charge storage material;
    etching the substrate into a plurality of isolation trenches separated by adjacent active areas, each active area of the substrate underlying one layer stack column;
    forming a first sacrificial film at least partially in the plurality of isolation trenches and a second sacrificial film over the first sacrificial film at least partially between adjacent layer stack columns, the first sacrificial film having a first etch rate and the second sacrificial film having a second etch rate that is lower than the first etch rate;

recessing the second sacrificial film below an upper surface of the strips of charge storage material;

forming an intermediate dielectric layer and a control gate layer after recessing the second sacrificial film; and etching to form a plurality of layer stack rows including first and second sidewalls, each layer stack row including a control gate that extends over a row of charge storage regions formed from the strips of charge storage material;

forming a liner along the first and second sidewalls of each layer stack row; and removing at least a portion of the first sacrificial film after forming the liner to form a bit line air gap at least partially in each isolation trench.

18. A method according to claim 17, wherein forming the first sacrificial film includes a flowable chemical vapor deposition process.

19. A method according to claim 18, further comprising:
curing the first sacrificial film using one or more of oxygen and ozone oxidants to increase the first etch rate.

20. A method according to claim 19, further comprising:
controlling a temperature of the substrate during the curing of the first sacrificial film to at least three hundred degrees Celsius; and
controlling a process pressure at six hundred Torr or less during the curing of the first sacrificial film.

21. A method according to claim 17, further comprising:
forming a plurality of word line air gaps between adjacent layer stack rows.

22. A method according to claim 21, wherein:
etching back the second sacrificial film includes removing all of the second sacrificial film.

* * * * *